United States Patent [19]

DePetris

[11] Patent Number: 5,659,212

[45] Date of Patent: Aug. 19, 1997

[54] RECTIFIER ASSEMBLY FOR AUTOMOTIVE ALTERNATOR

[75] Inventor: Peter S. DePetris, Youngstown, N.Y.

[73] Assignee: Electro-Dyn Choke Corporation, Niagara Falls, N.Y.

[21] Appl. No.: 357,419

[22] Filed: Dec. 16, 1994

[51] Int. Cl.$^6$ .................................................. H02K 11/00
[52] U.S. Cl. .......................................................... 310/68 D
[58] Field of Search ........................... 310/68 D; 363/145

[56] References Cited

U.S. PATENT DOCUMENTS

| | | | |
|---|---|---|---|
| 3,812,390 | 5/1974 | Richards | 310/68 D |
| 3,959,676 | 5/1976 | Striker | 320/68 D |
| 4,052,631 | 10/1977 | Kuter | 310/68 D |
| 4,065,686 | 12/1977 | Moore | 310/68 D |
| 4,137,560 | 1/1979 | Moore | 310/68 D |
| 4,169,282 | 9/1979 | Allport et al. | 310/68 D |
| 4,284,915 | 8/1981 | Hagenlocher et al. | 310/68 D |
| 4,288,711 | 9/1981 | Hagnlocher et al. | 310/68 D |
| 4,347,543 | 8/1982 | Frister et al. | 310/68 D |
| 4,419,957 | 12/1983 | Shiga et al. | 310/68 D |
| 4,606,000 | 8/1986 | Steele et al. | 310/68 D |
| 4,952,829 | 8/1990 | Armbruster et al. | 310/68 D |
| 5,451,823 | 9/1995 | Deverall et al. | 310/68 D |

*Primary Examiner*—Clayton E. LaBalle
*Attorney, Agent, or Firm*—Knobbe, Martens, Olson & Bear, LLP

[57] ABSTRACT

A poly-phase rectifier assembly for an alternating current generator includes five heat sinks, three of which are compression spring-loaded to form series electrical circuits to the poly-phase stator windings. The other two sinks are separated by a crush-proof, phenolic type, insulating gasket, and carry a plurality of semiconductor button-type diodes. The stator sinks are cupped to position compression springs, and are slotted for heat transfer. The stator sinks extend above the slotted positive heat sink into the cooling air flow area. A second embodiment utilizes back-to-back diodes, compression spring-loaded into a positive heat sink and a negative heat sink. A cupped stator heat sink forms a nest and provides series connection for the stator poly-phase windings. A plastic assembly supports a capacitor.

25 Claims, 10 Drawing Sheets

FIG. 10

RECTIFIER ASSEMBLY FOR AUTOMOTIVE ALTERNATOR

BACKGROUND OF THE INVENTION

1. Field of the Invention

The present invention relates to the field of automotive-type rectifier assemblies used to convert multi-phase alternating current to direct current using semiconductors located in the rear housing of the alternator. More particularly, the invention deals with the high power requirements and high under-hood temperatures associated with modern day automotive electronics. Further, the invention relates to the complex manufacturing problems created by the high power and high temperature requirements, and also relates to the extreme sensitivity of semiconductors to heat, thermal stress, compression and mechanical forces created during the manufacturing process and generated during long-term operation of the alternator.

2. Description of the Related Art

It should be understood that the power requirements for charging a storage battery alone are approximately 50 amperes or greater. In addition, power is needed to run the air conditioning, the head lamps, an onboard computer, a stereo system, and fans in the engine compartment and in the passenger compartment. Thus, the overall power consumption can exceed 70–90 amperes. The heat generated by the rectifier assembly in producing this much power must be rapidly dissipated in order to avoid breaking down the semiconductor material in the rectifier assembly. This is particularly true during the summer when the ambient temperatures are quite high so that the ambient air does not provide a significant cooling effect. Insufficient cooling of the rectifier assembly typically causes short-term life of the rectifier assembly and ultimately results in high cost repairs or replacement of the alternator.

The present invention is also concerned with automated manufacturing and installation of rectifier assemblies using semiconductor diodes and stamped-out heat sinks, terminals, gaskets and molded parts. The semiconductor diodes are extremely sensitive to thermal and mechanical stresses and forces typically associated with high volume manufacturing techniques, whereas the invention described herein avoids the stresses by gently placing and locking the sensitive semiconductors in place for a one-time riveting and soldering operation, while never exceeding the technical and handling specifications set forth by the manufacturers of the semiconductors.

The prior art teaches that poly-phase alternating current can be converted to direct current suitable for automotive use by using six semiconductor chips or button-type diodes, and by connecting the cathodes of three of the diodes to a positive D.C. heat sink, and by connecting the anodes of the remaining three diodes to a negative D.C. heat sink. The anode of one of the diodes on the positive heat sink is connected by a copper terminal to a cathode of a diode on the negative heat sink, thereby forming a set of diodes in series with the positive and negative D.C. heat sinks. A wire lead extending from phase one of the alternator poly-phase stator winding is connected to the series copper terminal of the first set of diodes. A phase two lead and a phase three lead also extend from the poly-phase stator windings and are similarly connected to the next two sets of diodes to complete the poly-phase series circuit through the positive/negative D.C. power output terminals and the storage battery charging system, as seen, for example, in FIG. 10.

Most rectifier assemblies use semiconductor diodes in their chip form, as illustrated by U.S. Pat. No. 4,606,000, assigned to General Motors Corporation. The chips are only 0.180"×0.012" in size in the ceramic form with glass passivated edges. The chips are extremely difficult to handle. Nickel-plated copper tabs, which are slightly larger than the chips, are soldered to the anodes and cathodes to strengthen them for the manufacturing process and for the thermal stresses which are incurred during normal operation.

The anodes of three of these chips are affixed to the semicircular copper negative D.C. heat sink. The cathodes of three other chips are affixed to an aluminum casted positive D.C. heat sink. The positive D.C. heat sink is much thicker than the negative heat sink and has a series of cooling slots which are extended out into the alternator's cooling airflow area. The positive heat sink is mounted above the negative heat sink, and separated by a very thin silicone/fiberglass woven insulation gasket. Three flat thin copper complex-formed terminal strips are formed to connect the stator leads to the diodes. Each terminal strip has three legs extending multi-directionally out of a plastic molded dove-tailed insulating support member. The insulating support member is press-fit into the three matching slots which are machined on the peripheral surface of the aluminum heat sink. The support members are then staked into position. Six of the thin copper legs are "U"-formed to align with and be affixed to the three sets of diodes located on the positive and negative heat sinks, respectively. The remaining three legs connect to the stator windings during alternator installation to form a series circuit through the poly-phase stator windings and the diodes. Prior to the alternator installation, the rectifier assembly is processed through multiple solder applications and solder furnace temperature stages to solder the semiconductors to the heat sinks. During this process, the semiconductors are held in position by a slight axial force from the copper "U" stator terminal above them. After the multiple stages of soldering are completed, and the noise suppressant capacitor is staked into position, a plastic cover is pushed into position and silicone rubber is injected around the semiconductor chips and capacitor to protect them from environmental hazards, such as salt spray, dust and metal particles. The rectifier assembly is then tested and installed into the alternator.

The prior art devices cannot transfer the heat generated by the diodes to the cooling air flow air rapidly enough to prevent thermal damage during high ambient temperatures because the conventionally used aluminum heat sink has approximately half the thermal conductivity of copper. An alternate thermal cooling path through the copper heat sink under the aluminum is further decreased by the silicone/fiberglass woven "insulator" gasket.

The top surfaces of the semiconductor chips soldered to the stator "U" terminals also cannot dissipate the heat of the semiconductor chips to the cooling air because the semiconductor chips are encapsulated in an insulating silicone after the plastic cover is installed. Thus, during high ambient summer temperatures and power loads, the semiconductors are thermally overloaded, causing premature alternator failures.

The prior art also presents high volume manufacturing problems associated with placing, locating and holding the extremely sensitive semiconductors in position for the soldering operation. The semiconductors are extremely light, and they tend to float up and around because the thin copper "U"-shaped stator terminals required to hold the semiconductors in position have minimal or no axial force. There is also a high cost associated with the ultrasonic welding process required to weld the copper diodes tabs to the aluminum heat sink because copper cannot be soldered to aluminum.

The thin silicone/fiberglass woven insulator gasket under the aluminum also presents major problems during installation of the rectifier assembly into the alternator. If the installation bolts are slightly over-torqued, the sharp edges of the aluminum heat sink will cut through the thin gasket to create a direct short circuit to the negative heat sink. The over-torquing may result in the positive plate shorting out to the negative plate. The gasket under the aluminum must be both thermally conductive and "thin" to allow the heat generated by the positive diodes on the aluminum to rapidly conduct into the copper heat sink and alternator housing, and ultimately into the ambient air.

If slightly under-torqued, the loss of thermal conductivity will cause the rectifier to overheat or become loose and to fail in the field. Even if the rectifier is installed at the recommended torque, the alternator will prematurely fail because of the high coefficient of expansion of the aluminum. The aluminum expands each time the engine is started and the temperature rises above 300° F., and the aluminum contracts when the engine is turned off and the temperature returns to the ambient temperature, which could be below 0° F. The repeated expansion and contraction of the aluminum positive heat sink also causes the rectifier assembly and the positive electrical output connection on the alternator housing to become loose. Once loose, the rectifier assembly begins to overheat, and the overheating results in the premature failure of the alternator.

Electrical problems inherent with aluminum have been well documented in the building industry. Most electrical codes have banned aluminum wiring because the terminal connections on the aluminum wire become loose, overheat and cause fires. Similar problems can occur with the use of aluminum connections in automotive rectifier assemblies.

Other rectifier manufacturers have attempted to solve the prior art manufacturing problems using the same semiconductor chips on the same aluminum and copper heat sinks with the same thin silicone/fiberglass insulator gasket separating the heat sinks. The other manufacturers merely replaced the dove-tailed, complex bent copper stator terminals with short 0.032" round copper molded into the plastic cover and extending downward with a thin, flat copper "S" termination instead of a "U" termination to apply an axial force against the semiconductor chips to hold the chips in place for the multiple soldering and encapsulation process. Consequently, the rectifier assemblies overheat, become loose and fail in the same manner as prior rectifier assemblies.

Still other manufacturers have tried replacing the glass passivated semiconductor chips (which were soldered on top of the aluminum and copper heat sinks) with "button"-type diodes. The three positive diodes were placed in three wells in the same type of aluminum heat sink with their respective anodes protruding above the top of the wells. The other three button diodes were placed on the same type of copper heat sink with their respective cathodes in alignment with the anodes of the diodes in the aluminum wells.

The cathode and anodes of the diode sets are secured in position by three thin, flat copper stator terminal strips which apply little or no axial force to hold the diodes down during the soldering process and during alternator operation in the field. As the solder begins to liquify, the molten liquid flows under the diodes to cause the diodes to float up and even tilt. The diodes thus lose approximately 50% of the thermal conductivity to the heat sinks.

Placing the diodes deep within the wells restricts the cooling air from flowing around the diodes. The use of the same silicone insulating gasket between the heat sinks creates the same inherent failure mode as in U.S. Pat. No. 4,606,000.

Other patents, such as U.S. Pat. No. 3,959,676, describe the use of button diodes which require an insulated circuit board and a complex "U"-shaped stator terminal. Still other patents, such as U.S. Pat. No. 4,065,686, describe systems requiring precision holes and computerized presses to gently press-fit diodes into cavities because of the extreme sensitivity of the diodes to shock, stress and compression forces.

The new and novel invention described herein eliminates all of the above problems and reduces manufacturing costs and failures by using compression springs to apply a predetermined force to the diode. Three extra stator heat sinks are added with slotted air cooling fins and slots extending into the alternator's cooling air supply area. A copper positive heat sink with high conductivity and 50% more surface area rapidly transfers the heat generated out of the diodes, thus lowering the operating temperature by approximately 15%, as shown, for example, in FIG. 1.

The present invention also replaces the complex manufacturing process with a simple riveting and soldering operation to produce a rectifier having an extended life and which is simple to install in the alternator.

SUMMARY OF THE INVENTION

The present invention provides a rectifier assembly which is manufactured in a simplified productive manner, using stamped and molded parts in a new and novel form to extend the life and to decrease the manufacturing failures and costs. In its present form, the rectifier is manufactured using five metal heat sinks. One heat sink is a negative D.C. heat sink and one heat sink is a positive D.C. heat sink. The other three heat sinks are stator heat sinks which are compressed against six semiconductor button-type diodes by six compression springs which preferably comprise stainless steel. The compression springs are nested within a phenolic cover which is riveted into a compact air-cooled package. Three of the six semiconductor "button"-type diodes are nested against the negative D.C. heat sink with the anodes down. The positive D.C. heat sink has three accurately registered clearance holes allowing the cathodes of the negative heat sink diodes to extend through the holes. The positive D.C. heat sink is placed above and against the negative heat sink, and is electrically insulated from the negative heat sink by a phenolic/fiberglass woven, electrically insulating gasket to allow maximum torquing during installation without crushing the gasket or shorting out between the heat sinks. The three remaining button diodes are nested against the positive D.C. heat sink with their respective cathodes contacting the positive D.C. heat sink. The registration and placement of these diodes are not random. Rather, the diodes are strategically placed to rapidly dissipate the tremendous heat generated by each diode while rectifying the alternating current to D.C. current. The two heat sinks and gasket are sandwiched together and aligned using a riveting fixture with disappearing anvil guide pins. The six diodes are then merely placed in their proper registration by polarity and with solder paste applied to their electrically conductive contact surface areas. Because of the above-described registration, the diodes are automatically aligned into three separate cathode/anode series circuits which are completed when the three stator heat sinks are applied and connected to their respective stator windings to complete the poly-phase electrical circuit. The three stator heat sinks are specially formed and extended with air ventilating slots. The three stator heat sinks nest to align each set of series diodes so as to rapidly dissipate the generated heat into the cooling air flow opposite the stator winding termination area. The stator heat sinks add three heat-dissipating sources to the normal two-heat-sink rectifier system to allow each diode to dissipate heat out of both the cathode and anode surface areas, thus decreasing expensive diode failures.

The three stator heat sinks are held in position for soldering by six high-temperature, stainless steel compression springs located in six cavities of the phenolic cap. The springs are adjusted so as not to exceed the critical compression force of 32 pounds recommended by Motorola, a principal manufacturer of the diodes. Some rectifier assemblies use computerized presses so as not to damage the diodes during installation, but the present invention merely uses the compression springs to secure the diodes in position for soldering and to extend the life of the rectifier assembly constructed in accordance with the present invention.

Once the molded phenolic cap is riveted into position, the six compression springs force the diode contact surface areas against the stator and against the D.C. heat sinks to create an excellent parallel surface-to-surface heat dissipating and electrical contact connection.

The molded cap also provides three slots to lock the stator termination ends into position to prevent accidental short circuiting during the crimping and soldering of the polyphase windings to the stator termination during final assembly and during service installations.

A further object of the present invention is to affix the capacitor used for electrical noise suppression into a firm vibration and heat protected position with the simplicity and ease of high volume productivity. This is accomplished using a plastic bushing with two formed brass terminals affixed to both ends to accept the capacitor leads for soldering or crimping. The bushing assembly is press-fit into the positive D.C. heat sink mounting hole which aligns the capacitor onto a cushioned bed of silicone rubber which insulates it from vibration and which provides a heat barrier from the negative heat sink. As the hold-down bolt is torqued down during installation, the capacitor is firmly locked into position and the bolt automatically causes a positive and negative electrical circuit to be completed through the positive and negative D.C. heat sinks. A copper spacer bushing is press-fit into the positive heat sink to provide an electrical connection for the voltage regular and the positive output stud when the rectifier installation nut is torqued down during installation. A centrally located plastic spacer bushing is also provided to allow the rectifier assembly to be evenly torqued down during installation to provide an excellent thermal and electrical connection in the alternator rear housing.

Another object of the present invention is to allow the semiconductor surface temperatures to exceed the solder melting temperatures while still maintaining excellent electrical and thermal conductivity for diode operation, and, as the temperature returns to normal, the surfaces re-solder themselves into their normal position.

Still another object of the present invention is to use all components which are pre-punched, formed and molded so as to be riveted in place using high volume, proven manufacturing processes and methods.

A further object of the present invention is to provide a rectifier assembly which operates under load at cooler temperatures than prior art rectifier assemblies. Comparative tests of various rectifier assemblies, including an OEM manufactured assembly, verify that the lower operating temperatures of the present invention meets and exceeds the objectives. Measurements of the temperature versus time have shown that while operating at 3600 r.p.m. using a 45–50 ampere load at 12.8 to 13.5 volts D.C., the present invention operates approximately 15% cooler than an OEM unit, and up to 50% cooler than competitive conventional type rectifiers. The higher operating temperatures and the failure to hold the semiconductor chips in a fixed position against the heat sinks are the primary causes for the exceptionally high failure rate of OEM rectifier assemblies due to arcing and the eroding away of the chips. This ultimately causes the entire alternator to be replaced with another unit which will also fail under the same conditions. By using the present invention, the components are permanently held in position during manufacturing and during long-term usage, to create a better, cheaper and longer lasting alternator which addresses and corrects these costly problems. This saves the money for consumers and decreases the usage of manufacturing power, which ultimately reduces air pollution into the atmosphere and environment.

BRIEF DESCRIPTION OF THE DRAWINGS

FIG. 3, comprising FIGS. 3A and 3B, illustrates an exploded view of the embodiment of FIG. 2, showing the simplicity of manufacturing.

DETAILED DESCRIPTION OF THE PREFERRED EMBODIMENT

As illustrated in FIGS. 2–6, a rectifier assembly 100 in accordance with one embodiment of the present invention comprises a negative D.C. copper heat sink 101, a positive D.C. heat sink 102, and a phenolic/fiberglass woven insulating gasket 103. The gasket 103 is used to electrically separate the negative and positive heat sinks, and is approximately 0.017 inches thick. The negative heat sink 101 has three nesting cavities 106a–c to nest semiconductor button-type diodes 104a–c having respective anodes 105a–c and having respective cathodes 107a–c. The positive heat sink 102 has three nesting cavities 114a–c to nest semiconductor button-type diodes 118a–c having respective cathodes 119a–c and having respective anodes 120a–c. Before the button diodes 104a–c are set in place, the negative heat sink 101, the gasket 103 and the positive heat sink 102 are stacked upon each other using a fixture (not shown) with alignment pins 131a–c to locate the proper hole registration in corresponding holes in the heat sinks and gaskets. Solder paste or solder tabs 117 are dispensed into the nest cavities 106a–c of the heat sink 101 and the nest cavities 114a–c of the heat sink 102. The button diodes 104a–c are then placed into the respective nest cavities 106a–c with their respective anodes 105a–c against the negative heat sink 101, and the button diodes 118a–c are placed into the nest cavities 114a–c of the positive heat sink 102 with the respective cathodes 119a–c of the diodes 118a–c positioned into the nests 114a–c. The bodies of the diodes 104a–c pass through the positive heat sink 102 through respective clearance holes 109a–c, and pass through clearance holes 108 of the gasket 103.

Figure 2:
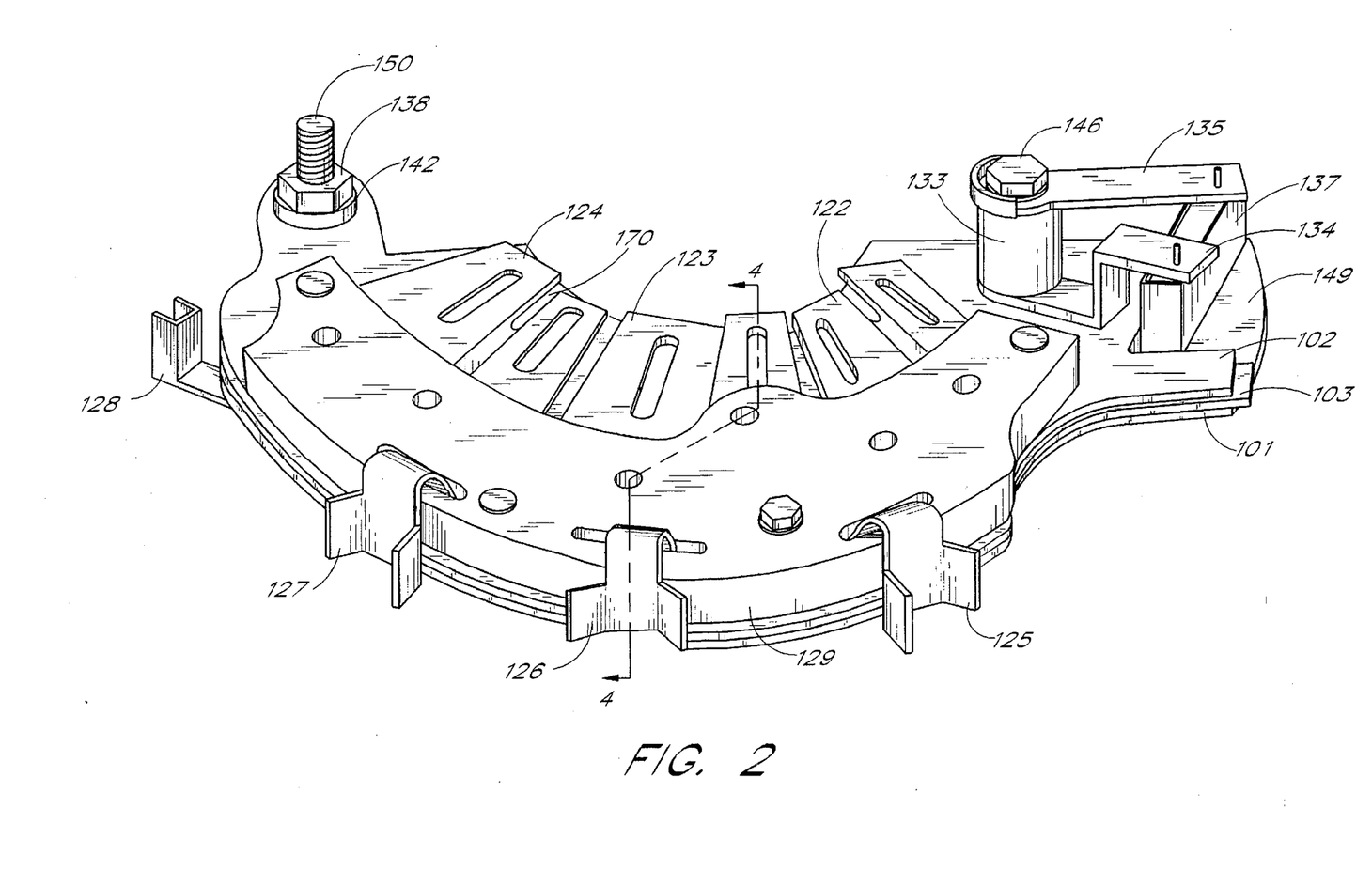
FIG. 2 illustrates a completed rectifier assembly in accordance with one embodiment of the present invention.
Figures 3, 3A:
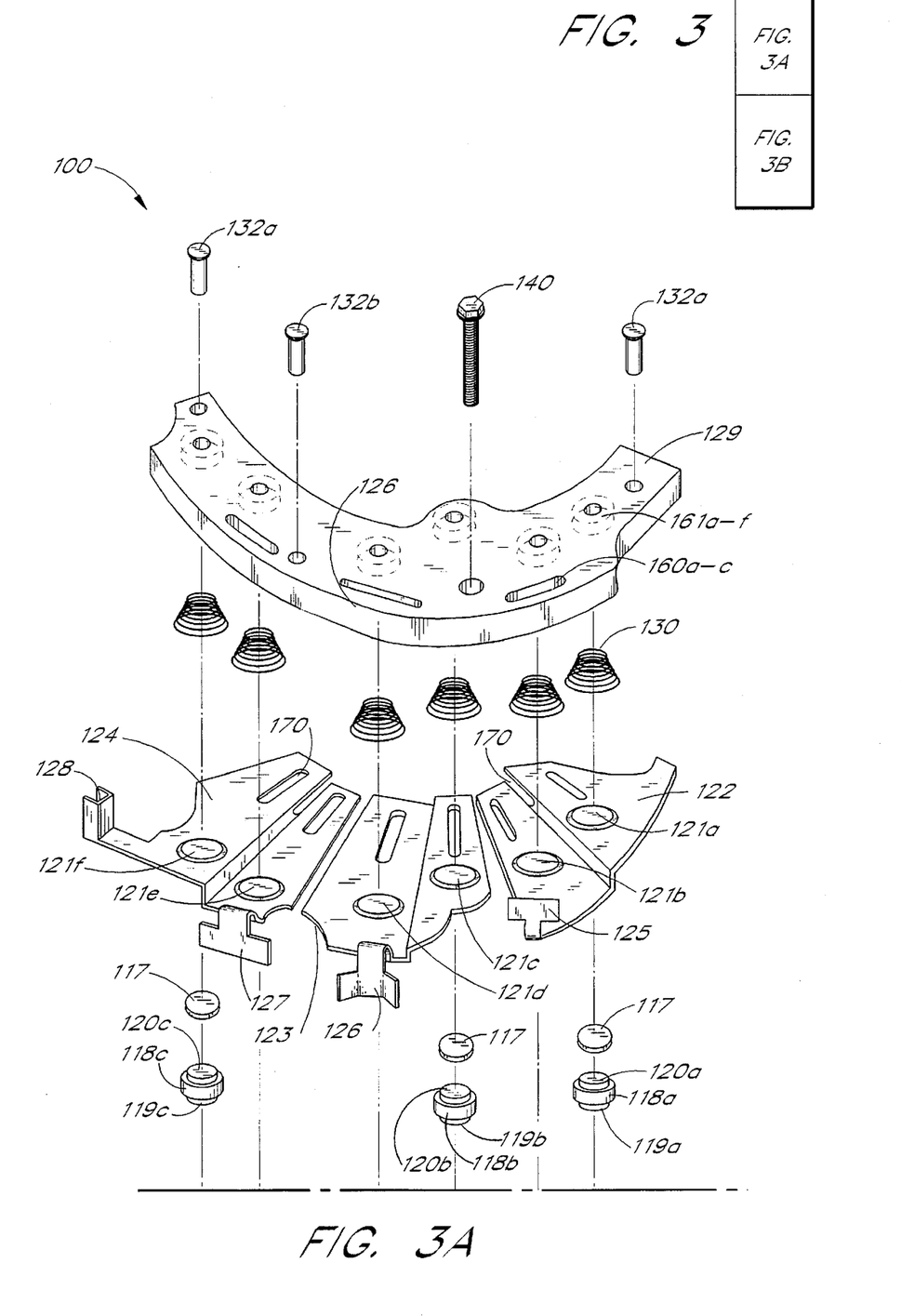
Figure 3B:
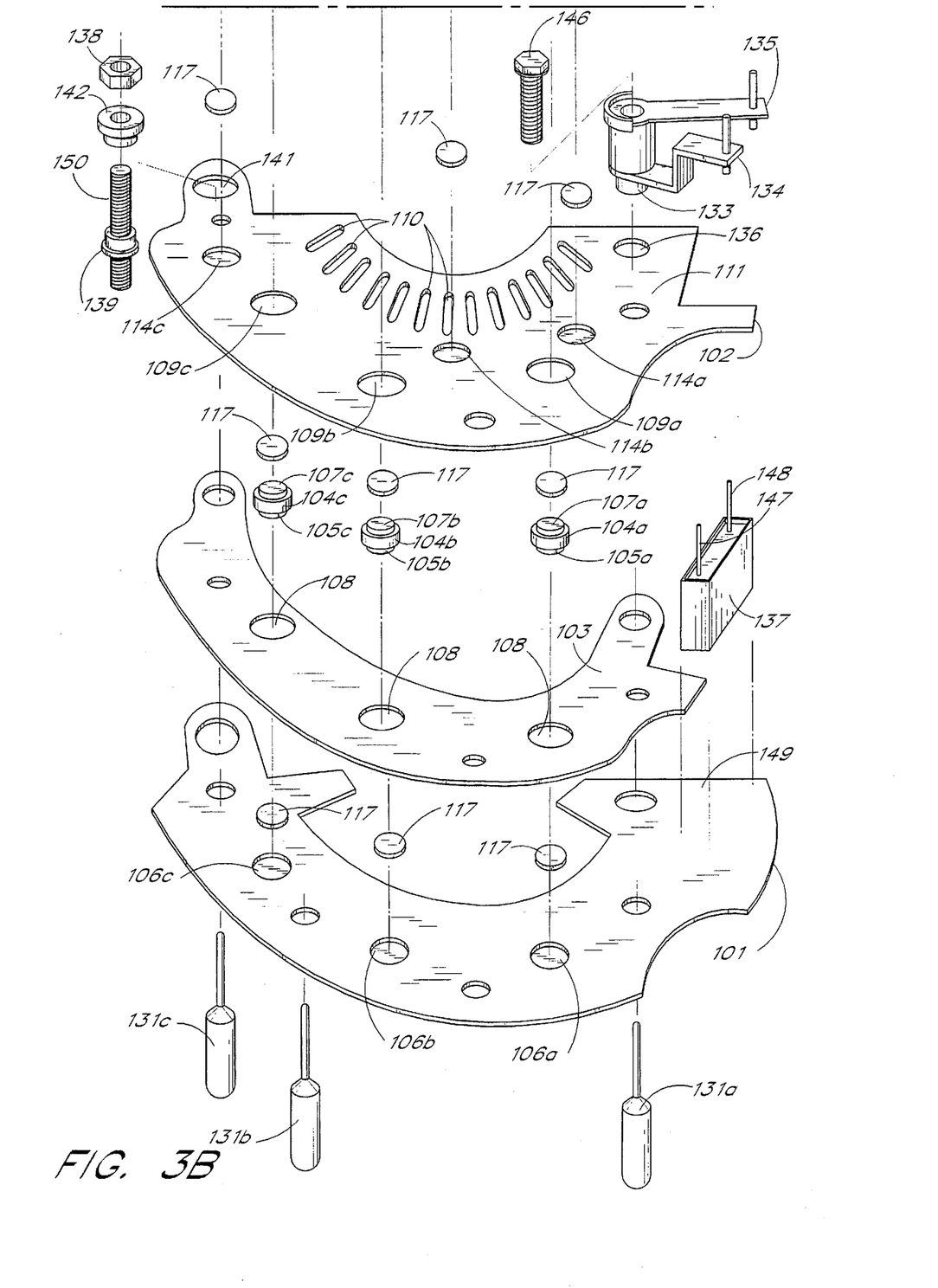
Figure 4:
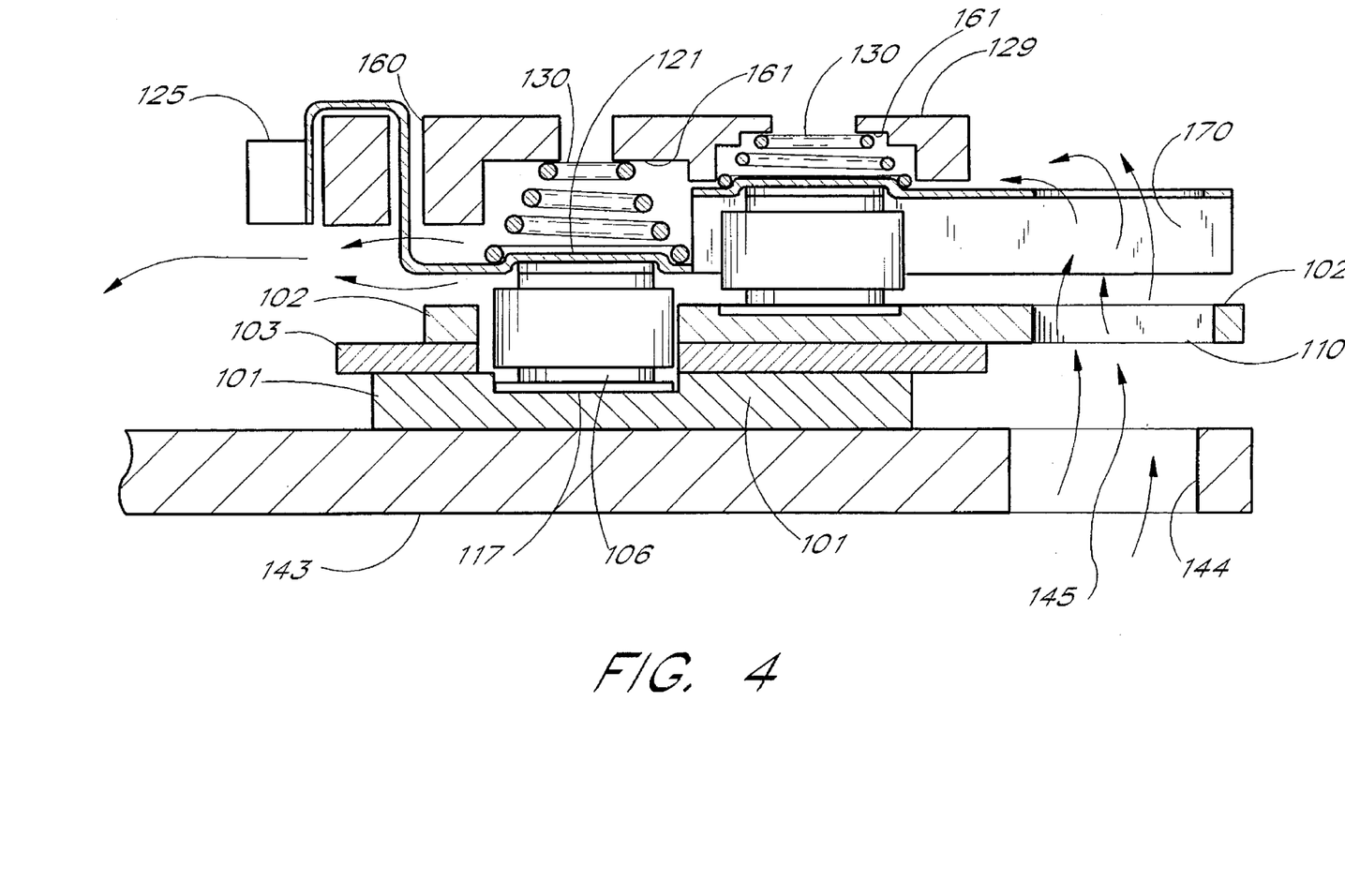
FIG. 4 illustrates a cross-sectional view of the assembled rectifier assembly in accordance with the present invention, taken along the lines 4—4 in FIG. 2, showing the position of the heat sinks and the diodes, and showing the housing and air flow for cooling.

Three stator heat sinks 122, 123, 124 have respective nesting cavities 121a–b, 121c–d and 121e–f. The nesting cavity 121a receives the anode 120a of the diode 118a. The nesting cavity 121b receives the cathode 107a of the diode 104a. The nesting cavity 121c receives the anode 120b of the diode 118b. The nesting cavity 121d receives the cathode 107b of the diode 104b. The nesting cavity 121e receives the cathode 107c of the diode 104c. The nesting cavity 121f receives the anode 120c of the diode 118c. It is particularly preferable at this time that the solder paste or solder tabs 117 be dispensed onto the anodes 120a–c and onto the cathodes 107a–c, or, alternatively, dispensed into the nest cavities 121a–f prior to installing the stator heat sinks 122, 123, 124 onto the anodes 120a–c and onto the cathodes 107a–c of the positive heat sink 102 and the negative heat sink 101.

The stator heat sink 122 is shown with a wire crimping tab 125 in its normal stamped position, which allows a phenolic cap 129 to be dropped over the tabs. A tab 126 of the stator heat sink 123 and a tab 127 of the stator heat sink 124 are shown in their formed positions after the phenolic cover 129 has been installed and riveted. The tab 126 is further shown partially bent in preparation for the crimping process. A further tab 128 of the stator heat sink 124 provides an electrical connection to a voltage regulator (not shown).

The three stator heat sinks 122, 123, 124 are placed on top of the diodes 104a–c and the diodes 118a–c which have been pre-registered by polarity. The diodes 104a–c and 118a–c are thus ready to be locked into position by a set of rivets 132a–c which secure the phenolic cover 129 with the tops of six compression springs 130 located in respective cavities 161a–f in the phenolic cover 129. The compression springs preferably comprise stainless steel.

Figures 6A, 6B:
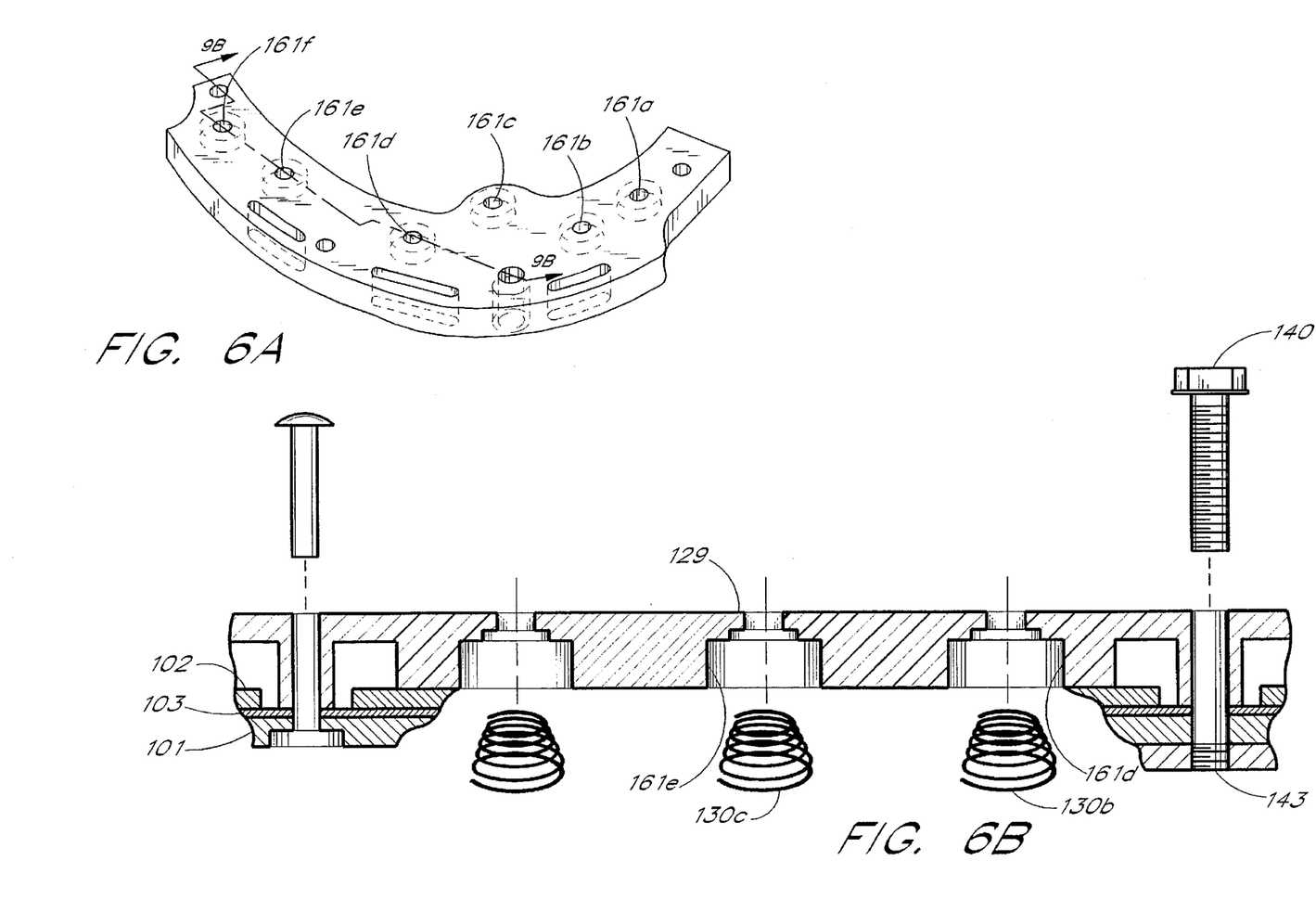
FIGS. 6A and 6B illustrate the nesting of the compression springs in the phenolic cover and the assembly hole layout of the embodiment of FIGS. 2–5.

As illustrated in more detail in FIG. 3A, the compression springs 130 are maintained in alignment during the manufacturing steps by raised portions of the three stator heat sinks 122, 123, 124 formed on opposite sides of the heat sinks from the cavities 121a–f. The phenolic cover 129 is then placed onto the disappearing anvil pin guides 131 which were previously used to guide and align the negative heat sink 101, the gasket 103 and the positive heat sink 102 into position for assembly. The tabs 125, 126 and 127 are passed through slots 160a–c in the phenolic cover 129. The compression springs 130 are received by cavities 161a–f in the phenolic cover 129 (see FIGS. 6A and 6B). The rectifier assembly 100, including the diodes 104a–c, 118a–c, the stator heat sinks 122, 123, 124 and the cover 129, can now be riveted and sent through a soldering or curing furnace operation. Note that the slots 160a–c may be open dovetailed slots, as illustrated in FIG. 3A, or the slots 160a–c may be oval-shaped slots, as illustrated in FIG. 6A.

After cooling, the rectifier assembly 100 is tested, and the tabs 125, 126, 127 are formed and aligned to accept the stator wire leads to prevent accidental shorting when the rectifier assembly is installed into the alternator. The tabs 125, 126, 127 are then crimped and soldered to the stator winding to complete the three series electrical circuits for the poly-phase stator.

Figure 5A:
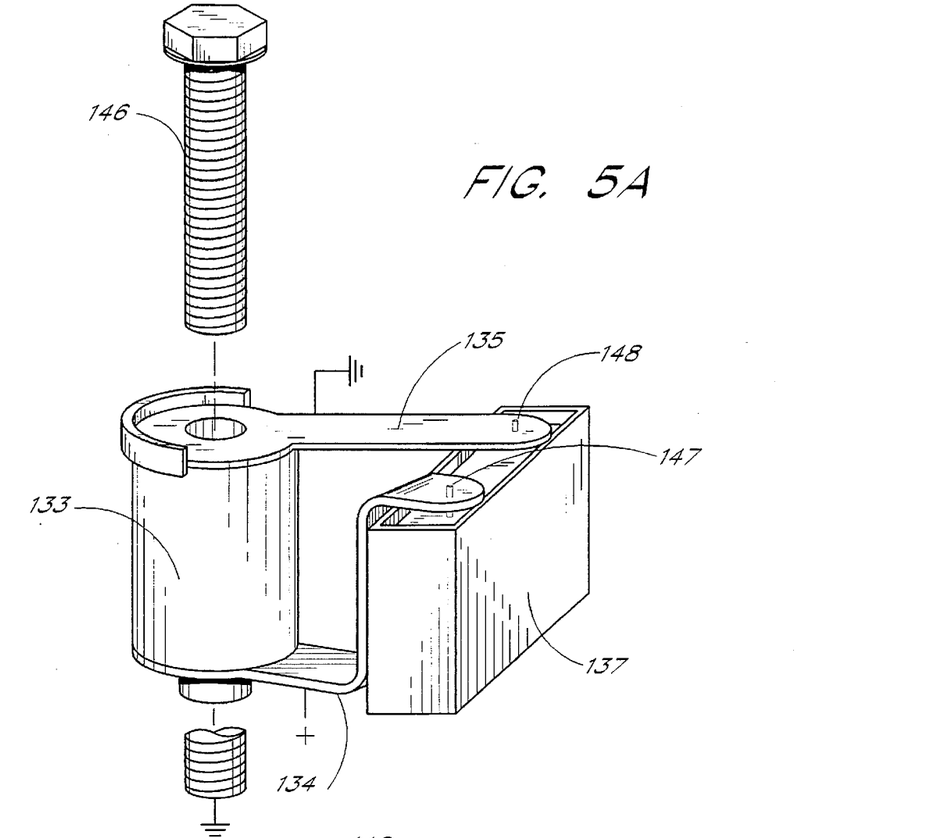
FIGS. 5A and 5B illustrate the capacitor mounting assembly with an installation bolt completing the electrical connection from one terminal of the capacitor to the negative ground potential of the alternator housing.
Figure 5B:
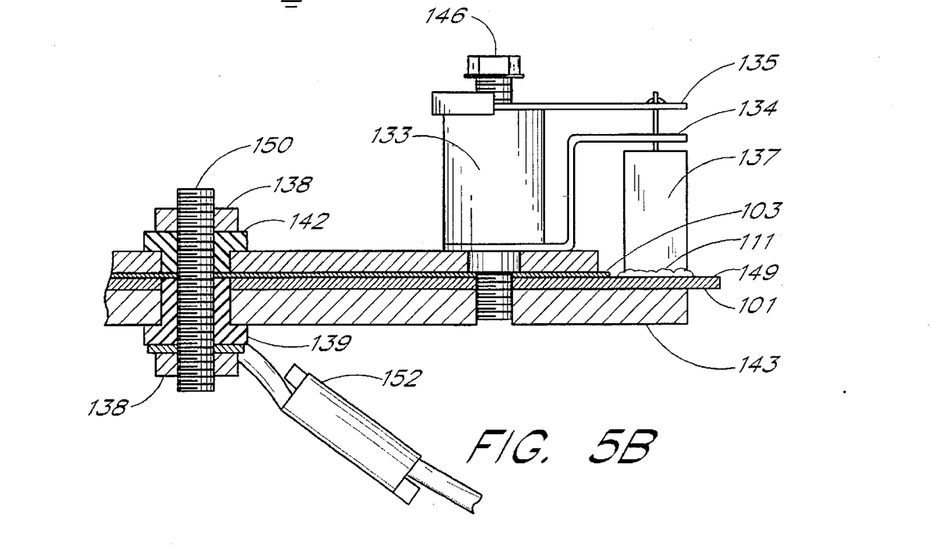

As shown in more detail in FIGS. 5A and 5B, an electrically insulating capacitor stand-off bushing 133, comprising plastic, for example, and having a pair of brass terminals 134, 135 mounted thereon, is pressed into a mounting hole 136 of the positive heat sink 102. A capacitor 137 is affixed in an open area 149 on the negative heat sink 101 using silicone rubber adhesive 111 (shown schematically in FIG. 5B). First and second leads 147, 148 of the capacitor 137 are soldered or crimped to the terminals 134, 135, respectively, to complete the positive electrical connection 102 and the negative electrical connection 101 for the capacitor 137 when the rectifier assembly is installed and a bolt 146 is torqued down to the housing 143. The bolt 146 completes the electrical connection between the brass terminal 135 and the negative heat sink 101 and the brass terminal 134 is in fixed electrical contact with the positive heat sink 102.

A copper spacer bushing 142 completes the electrical connection to the positive polarity components of the alternator when a nut 138 is torqued down onto a positive voltage stud 150 located through the housing 143 to a positive output connector 152 (see FIG. 5B which illustrates a cross-sectional view of a portion of the alternator housing 143). A plastic spacer bushing 139 insulates the stud 150 from the housing 143. The nut 138 and bolts 140 and 146 are used to torque the rectifier assembly 100 down to the housing 143 to create a good thermally conductive path for the negative heat sink 101 without introducing an electrically conductive path from the positive heat sink 102.

The alternator cooling fan system supplies cooling air flow (indicated by an arrow 145 in FIG. 4) through air ported windows 144 on the back side of the housing 143 to cool the copper positive heat sink 102 which has a series of vented slots 110 extending above the windows 144. The three stator heat sinks 122, 123, 124 include slots 170. The three stator heat sinks 122, 123, 124 extend above the positive heat sink 102 and are cooled by the same cooling air flow 145 through the slots 170 to create a rapid and an efficient heat transfer system to dissipate the heat generated by the diodes while converting alternating current to direct current in an automotive electrical system.

Figure 10:
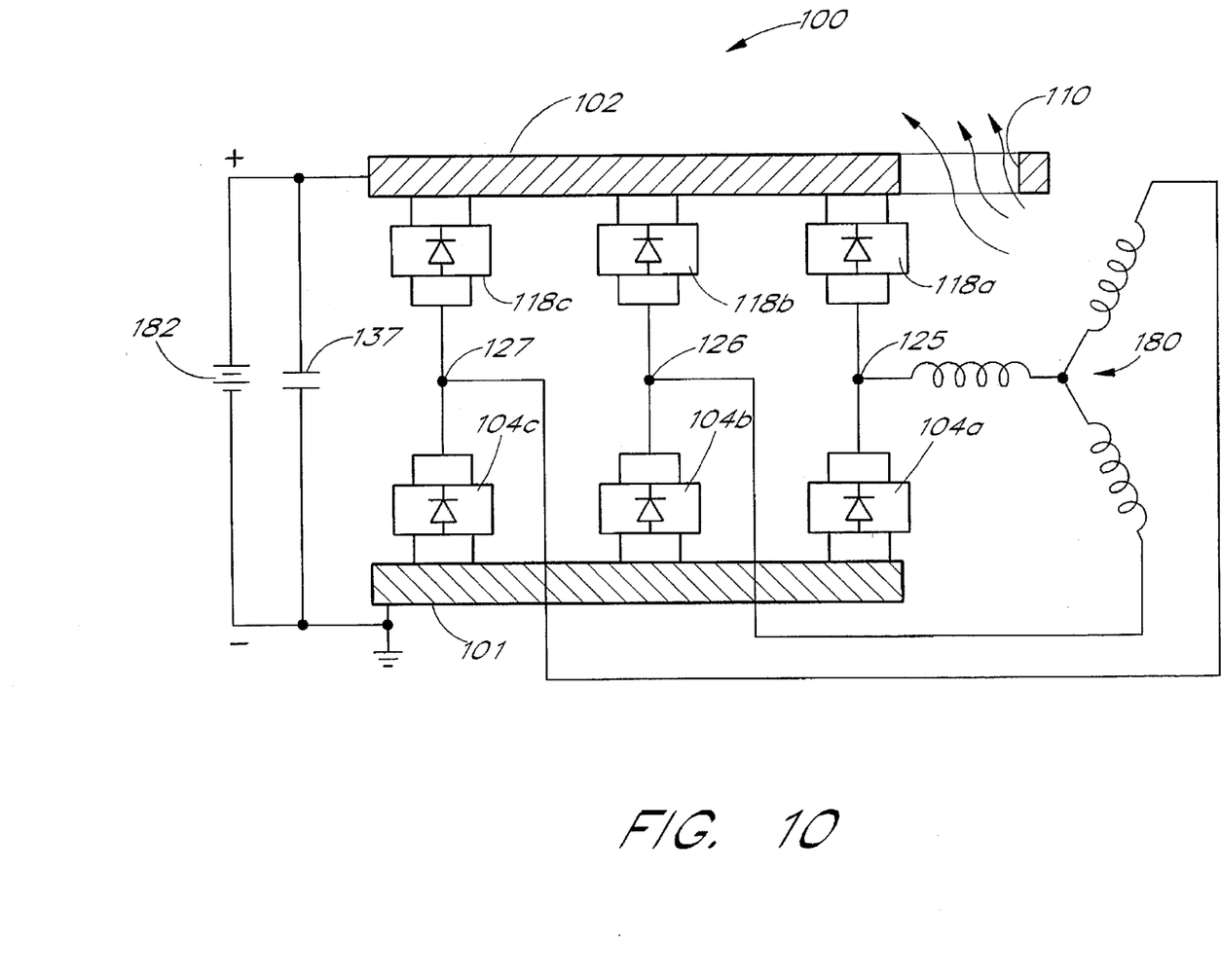
FIG. 10 illustrates an electrical schematic of the rectifier stator connections, capacitor connections and battery charging system from positive and negative heat sinks using cathodes from positive diodes and anodes from negative diodes.

FIG. 10 illustrates an electrical schematic of the completed assembly 100 which receives the electrical outputs from the stator windings 180 of a conventional alternator and which provides a D.C. output current to charge a conventional battery 182.

Figure 7:
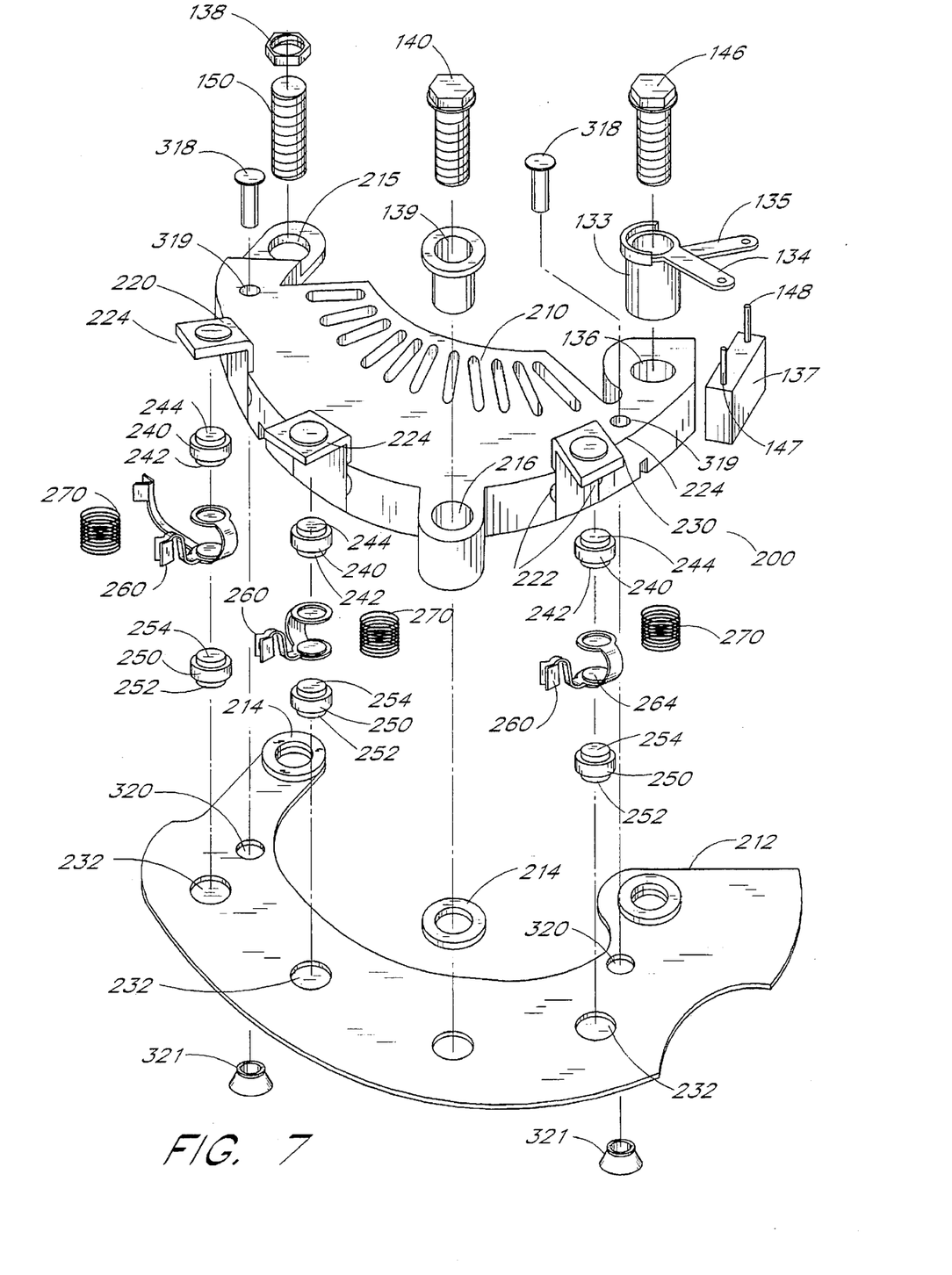
FIG. 7 illustrates an exploded view of another embodiment of the invention with back-to-back button diodes, with cooling air flowing around the diodes and between the heat sinks and further showing the simplicity of manufacturing.
Figure 8:
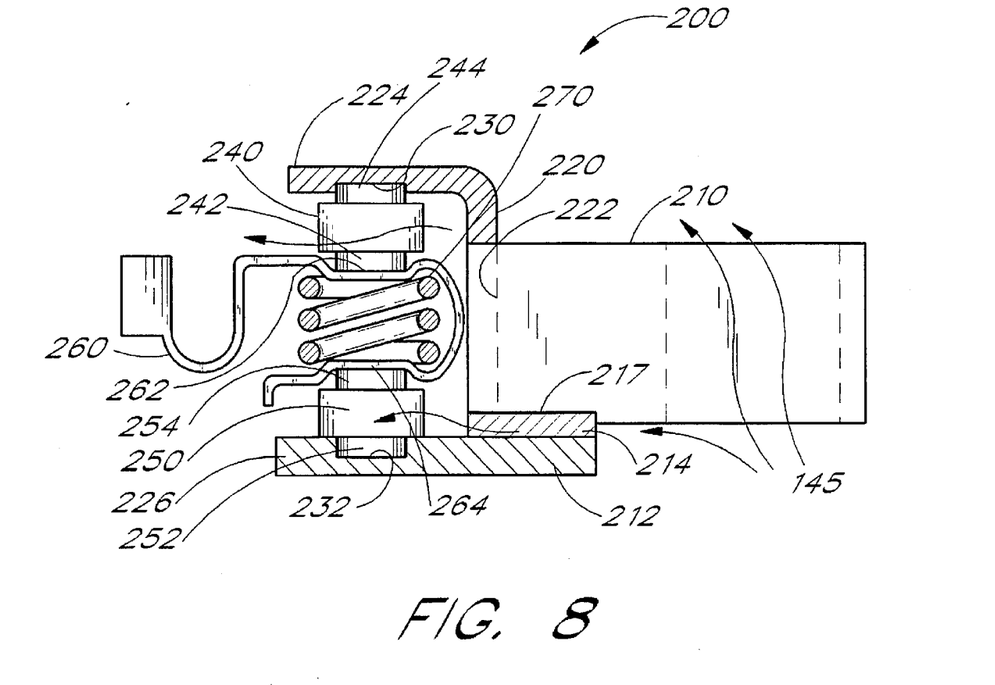
FIG. 8 illustrates a partial cross-sectional view of the embodiment of FIG. 7 pictorially illustrating the cooling air flowing around the diodes and between the heat sinks.

FIG. 7 illustrates an exploded view and FIG. 8 illustrates a partial cross-sectional view of a new or an existing rectifier assembly 200, such as the well known CS130, which is rebuilt in accordance with the present invention using modified heat sinks only. In particular, the rebuilt rectifier assembly 200 includes a positive heat sink 210 and a negative heat sink 212 which form part of the existing rectifier assembly. Three phenolic/fiberglass woven insulator ring gaskets 214 are nested under the mounting hole locations 215, 216 and 136 for the bolts 138, 140 and 146 to electrically and mechanically separate the positive heat sink 210 from the negative heat sink 212. The ring gaskets 214 are approximately 0.020" thick and allow heat transfer and air circulation between the two heat sinks (represented by an arrow 145 in FIG. 8) for cooling. The ring gaskets 214 will not crush or loosen after being torqued down during installation. The positive heat sink may advantageously include recesses 217 (shown as dashed lines in FIGS. 8 and 9) to receive a portion of the ring gaskets 214 to hold the ring gaskets 214 in fixed positions until the rivets or bolts are secured. The ring gaskets 214 may also be used in the embodiment of FIGS. 2–6 in place of the continuous gasket 103.

An L-shaped brass tab 220 is press fit into each of three existing dovetailed slots 222 of the positive heat sink 210 such that a horizontal portion 224 of each tab 220 overlies a portion 226 of the negative heat sink 212 when assembled. The horizontal portion 224 of the brass tab 220 includes a cavity 230, and the underlying portion 226 of the negative heat sink 212 includes a cavity 232 in substantial alignment with the cavity 230 when assembled.

A diode 240 having an anode 242 and a cathode 244 is positioned with the cathode 244 in the cavity 230. Similarly, a diode 250 having an anode 252 and a cathode 254 is positioned with the anode 252 in the cavity 232. A flexible brass tab 260 has a first offset or depressed portion 262 and a second offset or depressed portion 264. Each offset portion 262, 264 forms a respective depression on one side of the tab 260 and bump on the opposite side of the tab 260. The tab 260 is formed around a compression spring 270 so that the compression spring 270 is constrained between the two bumps caused by the offset portions 262, 264. The depression caused by one offset portion 262 is positioned to receive the anode 242 of the diode 240, and the depression caused by the offset portion 264 is positioned to receive the cathode 254 of the diode 250. While being held in these relative positions, the positive heat sink 210 is secured to the negative heat sink 212 by a pair of rivets 318 through holes 319 in the positive heat sink 210 and holes 320 in the negative heat sink 212. The rivets 318 are electrically isolated from the negative heat sink 212 by tapered insulators 321 which spread beneath the lower heads of the rivets when they are formed. The compression springs 270 are thus compressed to hold the diodes in fixed electrical and mechanical contact with the positive heat sink 210, the negative heat sink 212 and the flexible tab 260. Preferably, as discussed above in connection with the embodiment of FIGS. 2–6, the solder paste or solder tabs are positioned on the anodes and cathodes of the two diodes or in the receiving cavities and depressions prior to assembly to enhance the electrical contact between the components. It should be understood that the assembly of FIG. 6 is used for each of the three diode pairs for each stator winding. In alternative embodiments, air cooling slots can be cut between, under or on top of the positive heat sink 210 as illustrated by a dashed line 218 in FIG. 9.

Figure 9:
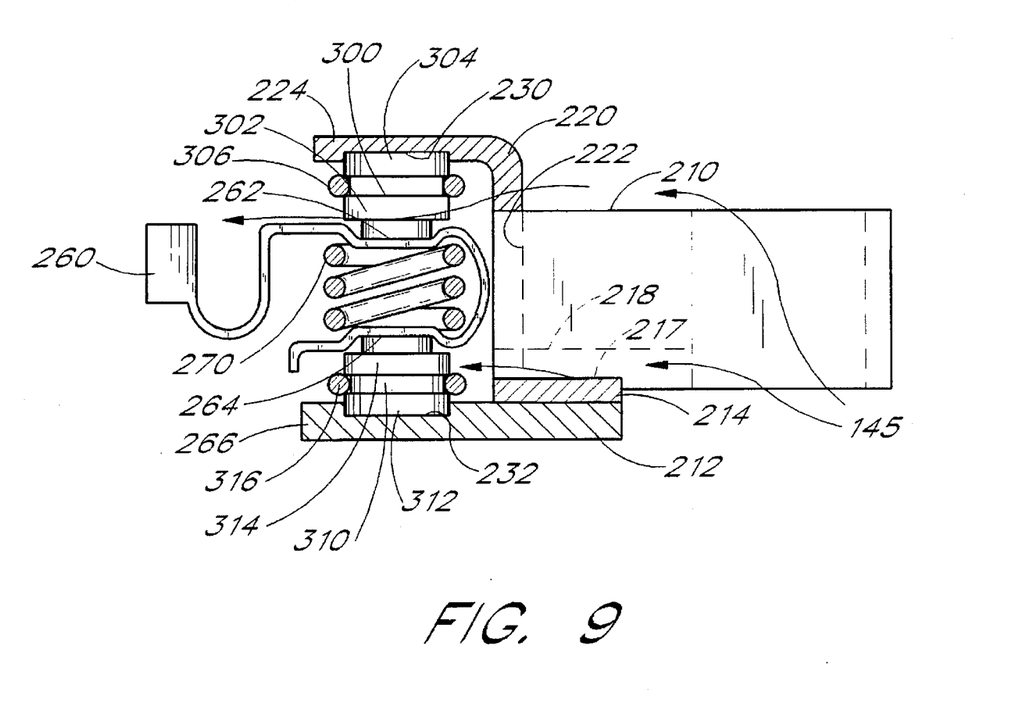
FIG. 9 illustrates a partial cross-sectional view similar to FIG. 8 with semiconductor chip diodes instead of button diodes.

FIG. 9 illustrates an alternative embodiment of an existing rectifier assembly rebuilt in accordance with the present invention. The embodiment of FIG. 9 is similar to the embodiment of FIGS. 7 and 8, and like components are identified with like numbers; however, semiconductor chips are used in FIG. 9 instead of the button-type diodes of FIGS. 7 and 8. In particular, a first semiconductor chip 300 has a pair of nickel-plated copper tabs 302, 304, which are slightly larger than the chip 300, soldered to the lower anode surface and upper cathode surface of the chip 300 in a conventional manner. Although the edges of the semiconductor chip 300 are preferably glass passivated, a silicon O-ring or adhesive 306 is positioned on the outer perimeter of the chip 300 between the extend perimeters of the tabs 302, 304 to seal the exposed edges from dust, humidity, and the like. The nickel-plated copper tabs 302 and 304 are respectively positioned in the cavity 262 of the flexible tab 260 and in the cavity 230 of the brass tab 220. A second semiconductor chip 310 is formed in like manner with a pair of nickel-plated copper tabs 312 and 314 soldered to its lower anode surface and its upper cathode surface, respectively. A silicon O-ring 316 seals the glass passivated edges of the chip 310. The second semiconductor chip 310 is positioned with the lower brass tab 312 nested in the cavity 232 of the negative heat sink 212 and with the upper brass tab 314 nested in the cavity 264 of the flexible tab 260. After positioning the semiconductor chips 300, 310 and the other semiconductor chips (not shown), the assembly is completed as before to compress the spring 270 and provide secure electrical and mechanical contact. Again, solder paste or tabs (not shown) are applied to the brass tabs 302, 304, 312, 314 or to the respective cavities (shown in FIG. 7) before assembly.

Figure 1:
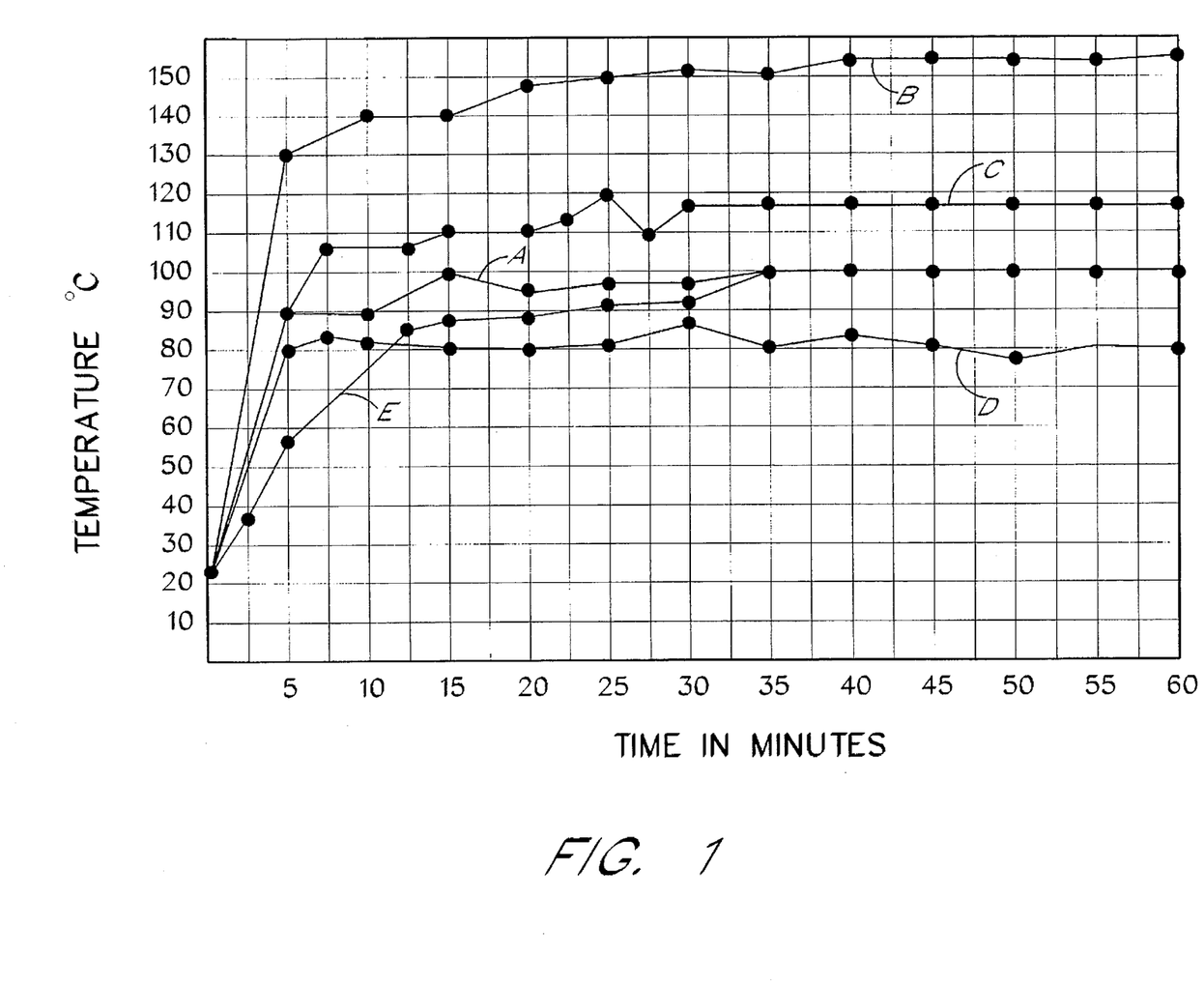
FIG. 1 illustrates the thermal comparison of various rectifier assemblies, including original equipment manufacturer (OEM) assemblies, competitive aftermarket assemblies, and the present invention.

As discussed above, the embodiments of the present invention provide a substantial improvement over the conventional rectifier assemblies by increasing the heat dissipation and thus reducing the operating temperature of the rectifier assembly. FIG. 1 illustrates graphs which compare the thermal characteristics of various rectifier assemblies. Line A illustrates the thermal profile of an OEM rectifier assembly. Line B illustrates the thermal profile of a competitive after-market rectifier assembly. Line C illustrates the thermal profile of the present invention without a finned stator heat sink (e.g., such as when implemented on a rebuilt rectifier assembly as illustrated in FIGS. 6 and 7). Line D illustrates the thermal profile of the present invention with a finned stator heat sink, as illustrated in FIGS. 2–5. Line E illustrates the thermal profile of a further competitive rectifier.

As described herein, this preferred embodiment of the present invention merely shows the simplicity, cost savings and reliability of the present invention. There are many other applications of the present invention which could deviate from the intent of the present invention; however, the intent of using the compression spring-loaded embodiment with nested stator heat sinks or other heat sinks which are slotted and extended into the cooling air flow to extend the life of the diodes because of the springs forcing a better contact system, and the intent of simplifying manufacturing and installation using phenolic type, crash-proof gaskets, is within the scope of the present invention as defined in the claims appended hereto.

What is claimed is:

1. A rectifier assembly mountable to the housing of a multi-phase alternating current generator to rectify A.C. current produced by the alternator into D.C. current, said rectifier assembly comprising:

a positive heat sink positioned in a first plane;

a negative heat sink positioned in a second plane parallel to said first plane;

a finned heat sink positioned in a third plane parallel to said first and second planes, said finned heat sink comprising a plurality of electrically isolated heat sink portions, each of said electrically isolated heat sink portions including a terminal electrically connectable to a respective stator winding of said alternator, at least a portion of said heat sink portions positioned in an air flow caused by the operation of said alternator;

a plurality of power diode pairs, each diode pair comprising a first diode and a second diode, each diode having an anode and a cathode, one diode of each pair having its anode connected to said negative heat sink and having its cathode connected to a respective one of said heat sink portions, the other diode of each pair having its anode connected to said respective one of said heat sink portions and having its cathode connected to said positive heat sink;

an electrically insulating cover; and a plurality of compression springs positioned between said cover and said finned heat sink portions to apply pressure to said finned heat sink portions to thereby apply pressure to said diodes to provide secure mechanical and electrical contact between said diodes and said heat sinks.

2. The rectifier assembly as defined in claim 1, wherein said compression springs are stainless steel.

3. The rectifier assembly as defined in claim 1, wherein said cover is a molded plastic cover.

4. The rectifier assembly as defined in claim 3, wherein said molded plastic cover is phenolic.

5. The rectifier assembly as defined in claim 1, wherein said positive and negative heat sinks support a plastic-type bushing having brass terminals which locate and position a capacitor for assembly and actual operation to decrease vibration damage to capacitor leads.

6. The rectifier assembly as defined in claim 1, further including a crush-proof, phenolic type, electrically insulating gasket positioned between said positive heat sink and said negative heat sink.

7. A rectifier assembly for an alternator having stator windings, said rectifier assembly comprising:

a plurality of finned, air-cooled stator heat sinks, having respective stator terminals formed thereon;

a negative polarity heat sink;

a copper positive polarity heat sink extending into the cooling air flow, said positive polarity heat sink having air cooling slots for heat dissipation, said positive polarity heat sink having a plurality of holes formed therein;

a first plurality of diodes supported by and connected to said positive polarity heat sink, said first polarity of diodes formed to fit parallel and above said negative polarity heat sink;

a second plurality of diodes supported by said negative polarity heat sink, said second plurality of diodes extending through said holes in said positive polarity heat sink and connecting electrically and thermally to said plurality of stator heat sinks; and a plurality of compression springs forcing said first plurality of diodes in secure mechanical and electrical contact with said stator heat sinks and said positive polarity heat sink and forcing said second plurality of diodes in secure mechanical and electrical contact with said stator heat sinks and said negative polarity heat sink.

8. A rectifier assembly as defined in claim 7, further including a plastic-type cover with molded slots, said plurality of stator terminals extending through said slots to be affixed to said stator windings of said alternator, said molded slots holding said stator terminals in fixed spaced apart relationship to preclude electrical connections between said stator terminals.

9. A rectifier assembly as defined in claim 8, wherein which said plastic-type covering includes a plurality of rivet holes, a plurality of spring cavities and a plurality of air flow openings, said plastic cover further including alignment holes to receive a plurality of alignment pins to align said rivet holes, said cavities and said air flow openings during manufacture of said rectifier.

10. A rectifier assembly as defined in claim 7, further including a plastic-type bushing which connects and supports a capacitor, said bushing having brass-type formed terminals to locate said capacitor in position for assembly and operation while also electrically connecting said capacitor to said positive polarity heat sink and said negative polarity heat sink.

11. A rectifier assembly for an alternator, comprising:

a negative heat sink;

a positive heat sink;

a plurality of pairs of diodes;

a plurality of heat sink tabs electrically and mechanically connected to said negative heat sink, each of said tabs having a respective cavity which receives a first terminal of a respective first diode of one of said pairs of diodes;

a plurality of cavities formed in said positive heat sink in alignment with said cavities of said plurality of tabs, said cavities each receiving a respective first terminal of a respective second diode of said one of said pairs of diodes;

a plurality of stator tabs, each stator tab electrically and mechanically connected with respective second terminals of said first diode and said second diode in said one of said pairs of first and second diodes; and a plurality of compression springs, each compression spring positioned proximate to a respective one of said stator tabs, each said compression spring applying force against said respective stator tab to force said first and second diodes in said one of said pairs of diodes in secure electrical and mechanical contact with said respective one of said stator tabs, said heat sink tabs and said negative heat sink.

12. The rectifier assembly as defined in claim 11, wherein said diodes comprise button-type diodes.

13. The rectifier assembly as defined in claim 11, further including a crush-proof, phenolic type, electrically insulating gasket positioned between said positive heat sink and said negative heat sink.

14. A rectifier assembly for an alternator having a plurality of stator windings, said rectifier assembly comprising:

a plurality of stator terminals, each stator terminal electrically connectable to a respective stator winding of said alternator;

a first heat sink and a second heat sink, said first heat sink electrically positive with respect to said second heat sink when said alternator is operating;

a plurality of diodes electrically connected between said first heat sink and said second heat sink, said diodes further connected to said plurality of stator terminals; and a plurality of compression springs, said compression springs applying force to said plurality of diodes to force said plurality of diodes into secure electrical and mechanical contact with said first heat sink, said second heat sink and said stator terminals.

15. The rectifier assembly as defined in claim 14, wherein said stator terminals are formed as a third heat sink, and wherein said compression springs are positioned between said third heat sink and respective terminals of said plurality of diodes.

16. The rectifier assembly as defined in claim 14, further including a crush-proof, phenolic type, electrically insulating gasket positioned between said first heat sink and said second heat sink.

17. The rectifier assembly as defined in claim 14, wherein said diodes are positioned in back-to-back configuration.

18. A rectifier assembly for a alternator having a plurality of stator windings, said rectifier assembly comprising:

a plurality of stator terminals, each stator terminal electrically connectable to a respective stator winding of said alternator;

a first heat sink and a second heat sink, said first heat sink electrically positive with respect to said second heat sink when said alternator is operating;

a plurality of diodes electrically connected between said first heat sink and said second heat sink, said diodes further connected to said plurality of stator terminals;

a plurality of compression springs, said compression springs applying force to said plurality of diodes to force said plurality of diodes into secure electrical and mechanical contact with said first heat sink, said second heat sink and said stator terminals;

wherein said diodes are positioned in back-to-back configuration; and wherein metal diode holders are staked into dovetailed grooves in said first heat sink.

19. The rectifier assembly as defined in claim 18, further including an air gap positioned between said first and second heat sinks.

20. The rectifier assembly as defined in claim 19, further including a crush-proof insulator positioned between said first and second heat sinks to space said first and second heat sinks apart to form said air gap.

21. The rectifier assembly as defined in claim 20, wherein said first and second heat sinks are secured together by rivets, said rivets electrically insulated from at least one of said first and second heat sinks.

22. A rectifier assembly for an alternator, said rectifier assembly comprising:

a first heat sink which provides an electrical connection for a positive voltage;

a second heat sink which provides an electrical connection for a negative voltage;

a plurality of diodes electrically connected between said first heat sink and said second heat sink;

a crush-proof gasket interposed between said first and second heat sinks, said crush-proof gasket providing electrical insulation between said first heat sink and said second heat sink; and a plurality of compression springs which apply force to hold each of said plurality of diodes in electrical and thermal contact with one of said first heat sink and said second heat sink.

23. The rectifier assembly as defined in claim 22, wherein said crush-proof gasket comprises a phenolic/fiberglass woven, electrically insulating gasket.

24. The rectifier assembly as defined in claim 22, wherein said crush-proof gasket comprises a plurality of spaced apart gaskets having air gaps therebetween, said air gaps permitting cooling air to flow between said first heat sink and said second heat sink.

25. The rectifier assembly as defined in claim 22, wherein said first heat sink and said second heat sink comprise heat sinks in a conventional rectifier assembly, and wherein said crush-proof gaskets are inserted between said first heat sink and said second heat sink to provide an electrical insulator which maintains electrical isolation between said first heat sink and said second heat sink when said first heat sink and said second heat sink are forced toward each other.

* * * * *